(12) United States Patent
Zhang et al.

(10) Patent No.: US 12,080,723 B2
(45) Date of Patent: Sep. 3, 2024

(54) ARRAY SUBSTRATE AND METHOD FOR FABRICATING SAME

(71) Applicant: Shenzhen China Star Optoelectronics Semiconductor Display Technology Co., Ltd., Guangdong (CN)

(72) Inventors: Jian Zhang, Guangdong (CN); Chaofan Liu, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 755 days.

(21) Appl. No.: 17/056,760

(22) PCT Filed: Oct. 22, 2020

(86) PCT No.: PCT/CN2020/122857
§ 371 (c)(1),
(2) Date: Nov. 19, 2020

(87) PCT Pub. No.: WO2022/052224
PCT Pub. Date: Mar. 17, 2022

(65) Prior Publication Data
US 2022/0320151 A1    Oct. 6, 2022

(30) Foreign Application Priority Data
Sep. 9, 2020  (CN) .......................... 202010939538.4

(51) Int. Cl.
*H01L 33/00*    (2010.01)
*H01L 27/12*    (2006.01)

(52) U.S. Cl.
CPC ...... *H01L 27/1244* (2013.01); *H01L 27/1259* (2013.01)

(58) Field of Classification Search
CPC ............. H01L 27/1214; H01L 27/1255; H01L 27/1259; H01L 27/14603;
(Continued)

(56) References Cited

U.S. PATENT DOCUMENTS 10,054,827 B2 *   8/2018   Ye ..................... G02F 1/133514
10,247,994 B2 *   4/2019   Zhang .................. G09G 3/3648
(Continued)

FOREIGN PATENT DOCUMENTS

CN    103488015    1/2014
CN    104516153    4/2015
(Continued)

*Primary Examiner* — Samuel Park

(57) ABSTRACT

An array substrate and a method for fabricating the same are provided. The array substrate includes a base substrate, a pixel unit, and a spacer stacked sequentially. The pixel unit includes a main pixel electrode and a thin film transistor. The main pixel electrode includes a main electrode, a plurality of branch electrodes, and a plurality of connection lines. The main electrode includes a first strip electrode and a second strip electrode crossing each other. The branch electrodes extend diagonally from the main electrode. The connection lines extend from some of the branch electrodes and are electrically connected to the thin film transistor. A projection of the spacer and a projection of the connection lines on the base substrate do not overlap, and the two projections do not overlap in a direction parallel to the first strip electrode and a direction parallel to the second strip electrode.

16 Claims, 5 Drawing Sheets

(58) Field of Classification Search
CPC ... H01L 2924/1517; H01L 2924/15184; H01L 29/4908; H01L 27/1244; H01L 27/1218; H01L 27/1248; G02F 1/13394; G02F 1/1337; G02F 1/1339; G02F 1/00; G02F 1/0107; G02F 2001/1635; G02F 1/16762; G02F 1/133377; G02F 1/13398; G02F 1/13392; G02F 1/136; G02F 1/13306; G02F 1/134336; G02F 1/136286; G02F 1/1368; G02F 1/133707; G02F 1/1343; G02F 1/136227; G02F 1/134309
USPC ..... 349/43, 48, 73, 108, 129, 139, 144, 146, 349/147, 156; 438/22, 29, 30, 34, 66, 438/107, 149, 158
See application file for complete search history.

(56) References Cited

U.S. PATENT DOCUMENTS

| | | | | |
|---|---|---|---|---|
| 2014/0049717 | A1* | 2/2014 | Kwak | G02F 1/133512 438/30 |
| 2015/0092138 | A1* | 4/2015 | Kwak | G02F 1/133512 349/110 |
| 2015/0103296 | A1* | 4/2015 | Kwak | G02F 1/13394 349/139 |
| 2016/0005766 | A1* | 1/2016 | Choi | H01L 21/76877 438/158 |
| 2016/0202527 | A1* | 7/2016 | Kim | G02F 1/1339 349/58 |
| 2016/0299398 | A1* | 10/2016 | Lee | H01L 29/78669 |
| 2016/0320672 | A1* | 11/2016 | Hong | G02F 1/13394 |
| 2016/0322397 | A1* | 11/2016 | Lee | H01L 27/1225 |
| 2018/0074355 | A1* | 3/2018 | Cheng | G02F 1/136286 |
| 2020/0142228 | A1* | 5/2020 | Hong | H01L 27/1288 |

FOREIGN PATENT DOCUMENTS

| | | | | | |
|---|---|---|---|---|---|
| CN | 103489876 | B | * | 7/2016 | ......... H01L 27/124 |
| CN | 205507295 | | | 8/2016 | |
| CN | 106783732 | A | * | 5/2017 | ....... G02F 1/134309 |
| CN | 106950767 | | | 7/2017 | |
| CN | 106950768 | A | * | 7/2017 | ......... G02F 1/13306 |
| CN | 106990619 | | | 7/2017 | |
| CN | 107479287 | A | * | 12/2017 | ......... G02F 1/1333 |
| CN | 109212842 | | | 1/2019 | |
| CN | 111208677 | | | 5/2020 | |
| WO | WO-2016155194 | A1 | * | 10/2016 | ...... H01L 21/76805 |
| WO | WO-2019037298 | A1 | * | 2/2019 | .......... G02F 1/1362 |

* cited by examiner

ARRAY SUBSTRATE AND METHOD FOR FABRICATING SAME

RELATED APPLICATIONS

This application is a National Phase of PCT Patent Application No. PCT/CN2020/122857 having International filing date of Oct. 22, 2020, which claims the benefit of priority of Chinese Patent Application No. 202010939538.4 filed on Sep. 9, 2020. The contents of the above applications are all incorporated by reference as if fully set forth herein in their entirety.

FIELD AND BACKGROUND OF THE INVENTION

The present disclosure relates to the technical field of display, and particularly to an array substrate and a method for fabricating the same.

A curvature of a curved panel is designed to be substantially same as a curvature of a retina of a human eye. Therefore, compared with a flat panel, the curved panel not only has a greater display area, but also provides a better sense of presence, allowing people to have a more comfortable viewing experience.

A conventional method for fabricating the curved panel comprises: forming red, green, and blue resist layers and photo spacers (PSs) on a color filter (CF) substrate, disposing the CF substrate and a thin film transistor (TFT) array substrate opposite to each other to form a panel, and bending the panel to form the curved panel. When the panel is bent, a radius of curvature of the CF substrate is less than that of the TFT array substrate. Therefore, the red, green, and blue resist layers and the photo spacers on the CF substrate are easily displaced, which easily causes unevenness in liquid crystal cell gap and color-mix. Therefore, in a current method, red, green, and blue resist layers and photo spacers are generally disposed on a TFT array substrate, i.e. photo spacer on array (POA) technology, to prevent unevenness in liquid crystal cell gap and color-mix.

Furthermore, in order to improve viewing angles of panels and reduce color shift, polymer sustained vertical alignment (PSVA) pixels having 8 domains and 3 transistors (3T_8 domain) are gradually applied to large-size panels.

Please refer to FIG. 1, in a pixel of a current array substrate 500 using POA technology and PSVA pixels, a spacer 501 usually covers and/or is adjacent to a part of a connection line 511 and a part of a connection portion 512 of a main pixel electrode 510. Please refer to FIG. 2A, a color resist layer 502 is prone to a crack 503 due to abnormal film formation. Please refer to FIG. 2B, an external force F is transmitted to the color resist layer 502 through the spacer 501, so that the crack 503 spreads to an underside of the connection line 511, and the connection line 511 will peel off and bend. Please refer to FIG. 2C and FIG. 3, under a continuous action of the external force F, the micro crack 503 gradually spreads. As a result, the connection line 511 is broken, so that a signal cannot be transmitted to a main pixel area, and the array substrate 500 displays poorly.

SUMMARY OF THE INVENTION

In order to solve the technical problem that a connection line of a main pixel electrode near a spacer in a current array substrate is easily broken due to a crack in a color resist layer, the present disclosure provides the following technical solutions.

The present disclosure provides an array substrate comprising a base substrate, a pixel unit, and a spacer. The pixel unit is disposed on the base substrate and comprises a main pixel electrode, a sub pixel electrode, and a first thin film transistor disposed between the main pixel electrode and the sub pixel electrode. The main pixel electrode comprises a first main electrode, a plurality of first branch electrodes, and a plurality of first connection lines. The first main electrode comprises a first strip electrode and a second strip electrode crossing each other. The first branch electrodes extend diagonally from the first main electrode. Each of the first connection lines extends from a corresponding first branch electrode and is electrically connected to the first thin film transistor. The spacer is disposed on the pixel unit and between the main pixel electrode and the sub pixel electrode. A projection of the spacer on the base substrate and a projection of the first connection lines on the base substrate do not overlap, and the two projections do not overlap in a direction parallel to the first strip electrode and a direction parallel to the second strip electrode.

In an embodiment, the projection of the spacer on the base substrate and the projection of the first connection lines on the base substrate are separated by a first distance in the direction parallel to the first strip electrode, and by a second distance in the direction parallel to the second strip electrode.

In an embodiment, the main pixel electrode further comprises a U-shaped first frame electrode, and one of the first connection lines extends from one of the ends of the first frame electrode and is electrically connected to the first thin film transistor.

In an embodiment, the main pixel electrode further comprises a first connection portion connected to the first connection lines. The first thin film transistor comprises a first drain electrode and a first drain extension portion extending from the first drain electrode. The first connection portion is electrically connected to the first drain extension portion through a first via hole, so that the first connection lines are electrically connected to the first thin film transistor.

In an embodiment, the pixel unit further comprises a second thin film transistor disposed between the main pixel electrode and the sub pixel electrode. The sub pixel electrode comprises a second main electrode, a plurality of second branch electrodes, and a plurality of second connection lines. The second main electrode comprises a third strip electrode and a fourth strip electrode crossing each other. The third strip electrode is parallel to the first strip electrode. The second branch electrodes extend diagonally from the second main electrode. Each of the second connection lines extends from a corresponding second branch electrode and is electrically connected to the second thin film transistor. The projection of the spacer on the base substrate and a projection of the second connection lines on the base substrate do not overlap, and the two projections do not overlap in a direction parallel to the third strip electrode and a direction parallel to the fourth strip electrode.

In an embodiment, the projection of the spacer on the base substrate and the projection of the second connection lines on the base substrate are separated by a third distance in the direction parallel to the third strip electrode, and by a fourth distance in the direction parallel to the fourth strip electrode.

In an embodiment, the sub pixel electrode further comprises a U-shaped second frame electrode, and one of the second connection lines extends from one of the ends of the second frame electrode and is electrically connected to the second thin film transistor.

In an embodiment, the sub pixel electrode further comprises a second connection portion connected to the second connection lines. The second thin film transistor comprises a second drain electrode and a second drain extension portion extending from the second drain electrode. The second connection portion is electrically connected to the second drain extension portion through a second via hole, so that the second connection lines are electrically connected to the second thin film transistor.

The present disclosure further provides a method for fabricating an array substrate. The method comprises: providing a base substrate, forming a pixel unit on the base substrate, and forming a spacer on the pixel unit. The pixel unit comprises a main pixel electrode, a sub pixel electrode, and a first thin film transistor disposed between the main pixel electrode and the sub pixel electrode. The main pixel electrode comprises a first main electrode, a plurality of first branch electrodes, and a plurality of first connection lines. The first main electrode comprises a first strip electrode and a second strip electrode crossing each other. The first branch electrodes extend diagonally from the first main electrode. Each of the first connection lines extends from a corresponding first branch electrode and is electrically connected to the first thin film transistor. The spacer is disposed on the pixel unit and between the main pixel electrode and the sub pixel electrode. A projection of the spacer on the base substrate and a projection of the first connection lines on the base substrate do not overlap, and the two projections do not overlap in a direction parallel to the first strip electrode and a direction parallel to the second strip electrode.

In an embodiment, the projection of the spacer on the base substrate and the projection of the first connection lines on the base substrate are separated by a first distance in the direction parallel to the first strip electrode, and by a second distance in the direction parallel to the second strip electrode.

In an embodiment, the main pixel electrode further comprises a U-shaped first frame electrode, and one of the first connection lines extends from one of the ends of the first frame electrode and is electrically connected to the first thin film transistor.

In an embodiment, the main pixel electrode further comprises a first connection portion connected to the first connection lines. The first thin film transistor comprises a first drain electrode and a first drain extension portion extending from the first drain electrode. The first connection portion is electrically connected to the first drain extension portion through a first via hole, so that the first connection lines are electrically connected to the first thin film transistor.

In an embodiment, the pixel unit further comprises a second thin film transistor disposed between the main pixel electrode and the sub pixel electrode. The sub pixel electrode comprises a second main electrode, a plurality of second branch electrodes, and a plurality of second connection lines. The second main electrode comprises a third strip electrode and a fourth strip electrode crossing each other. The third strip electrode is parallel to the first strip electrode. The second branch electrodes extend diagonally from the second main electrode. Each of the second connection lines extends from a corresponding second branch electrode and is electrically connected to the second thin film transistor. The projection of the spacer on the base substrate and a projection of the second connection lines on the base substrate do not overlap, and the two projections do not overlap in a direction parallel to the third strip electrode and in a direction parallel to the fourth strip electrode.

In an embodiment, the projection of the spacer on the base substrate and the projection of the second connection lines on the base substrate are separated by a third distance in the direction parallel to the third strip electrode, and by a fourth distance in the direction parallel to the fourth strip electrode.

In an embodiment, the sub pixel electrode further comprises a U-shaped second frame electrode, and one of the second connection lines extends from one of the ends of the second frame electrode and is electrically connected to the second thin film transistor.

In an embodiment, the sub pixel electrode further comprises a second connection portion connected to the second connection lines. The second thin film transistor comprises a second drain electrode and a second drain extension portion extending from the second drain electrode. The second connection portion is electrically connected to the second drain extension portion through a second via hole, so that the second connection lines are electrically connected to the second thin film transistor.

In the array substrate and the method for fabricating the same provided by the present disclosure, the connection lines of the main pixel electrode and/or the sub pixel electrode are disposed far away from the spacer, so that the projections of the spacer and the connection lines of the main pixel electrode and/or the sub pixel electrode on the base substrate do not overlap, nor do they overlap in the direction parallel to the first/third strip electrode and the direction parallel to the second/fourth strip electrode. Preferably, distances between the projection of the spacer on the base substrate and the projections of the connection lines of the main pixel electrode and/or the sub pixel electrode on the base substrate in the direction parallel to the first/third strip electrode and the direction parallel to the second/fourth strip electrode are greater than 0 μm. Therefore, it is difficult for an external force to make a crack in a color resist layer spread to an underside of the connection lines away from the spacer, thereby preventing the connecting lines from being broken. Furthermore, the connection lines of the main pixel electrode and/or the sub pixel electrode are designed to be multiple, so that when one or two connection lines are broken, a signal can still be transmitted to the main pixel electrode and/or the sub pixel electrode through other unbroken connection lines. Therefore, the present invention can effectively prevent poor display of the array substrate.

BRIEF DESCRIPTION OF THE SEVERAL VIEWS OF THE DRAWINGS

In order to more clearly illustrate technical solutions in embodiments of the present disclosure or the prior art, a brief description of accompanying drawings used in the embodiments or the prior art will be given below. The accompanying drawings in the following description are merely some embodiments of the present disclosure. For those skilled in the art, other drawings may be obtained from these accompanying drawings without creative labor.

DESCRIPTION OF SPECIFIC EMBODIMENTS OF THE INVENTION

Technical solutions in embodiments of the present disclosure will be clearly and completely described below in conjunction with accompanying drawings. The described embodiments are merely a part of the embodiments of the present disclosure and not all embodiments. All other embodiments obtained by those skilled in the art based on the embodiments of the present disclosure without creative labor are within claimed scope of the present disclosure.

In a description of the present disclosure, orientation or positional relationship indicated by terms, such as "above", "below", "top", "bottom", "left", "right", "inside", "outside", and "side", is based on orientation or positional relationship shown in the accompanying drawings, and is merely for convenience and simplification of the description of the present disclosure. Furthermore, terms such as "first" and "second" are used merely for description, but shall not be construed as indicating or implying relative importance. Features defined with the terms, such as "first" and "second", may explicitly or implicitly include one or more such features.

Figure 1:
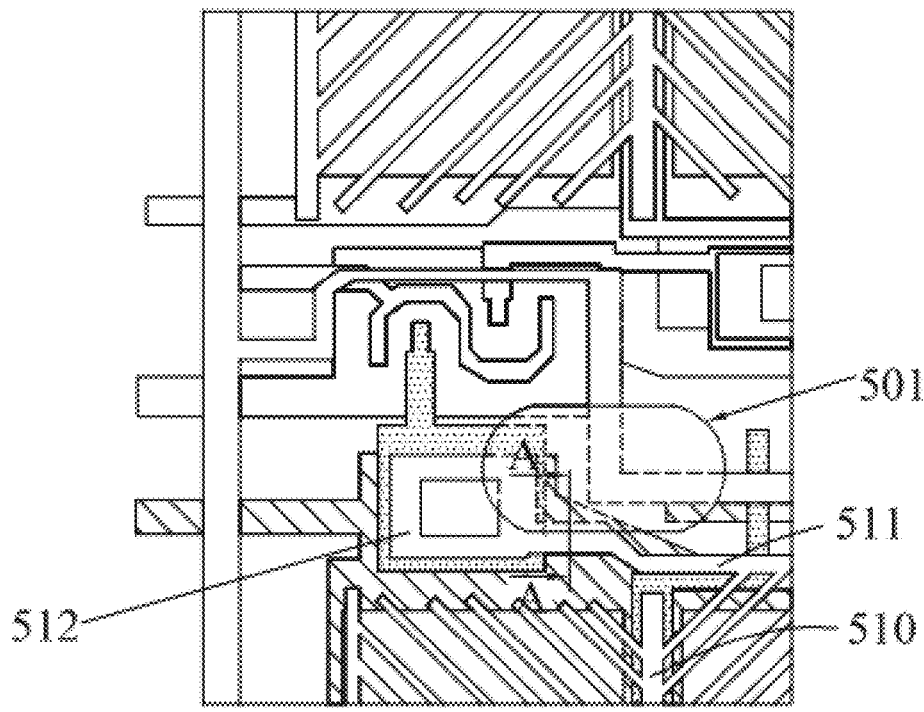
FIG. 1 is a partial schematic diagram of an array substrate in the prior art.
Figure 2A:
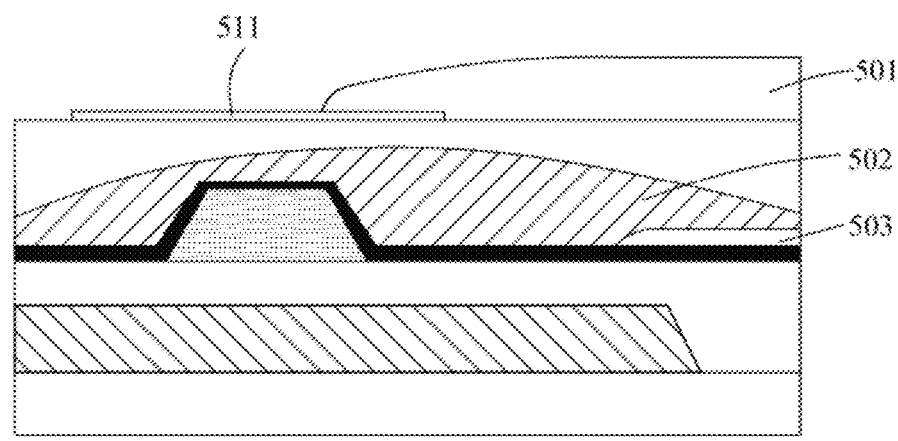
FIGS. 2A, 2B and 2C are schematic cross-sectional views of the array substrate of FIG. 1 along line A-A, showing that under a continuous action of an external force, a crack in a color resist layer gradually spreads, causing a connection line to bend and then break.
Figure 2B:
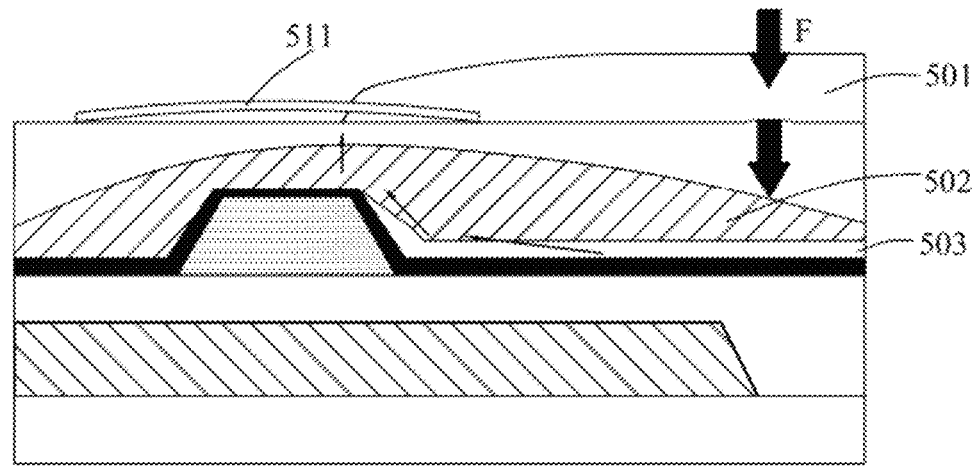
Figure 2C:
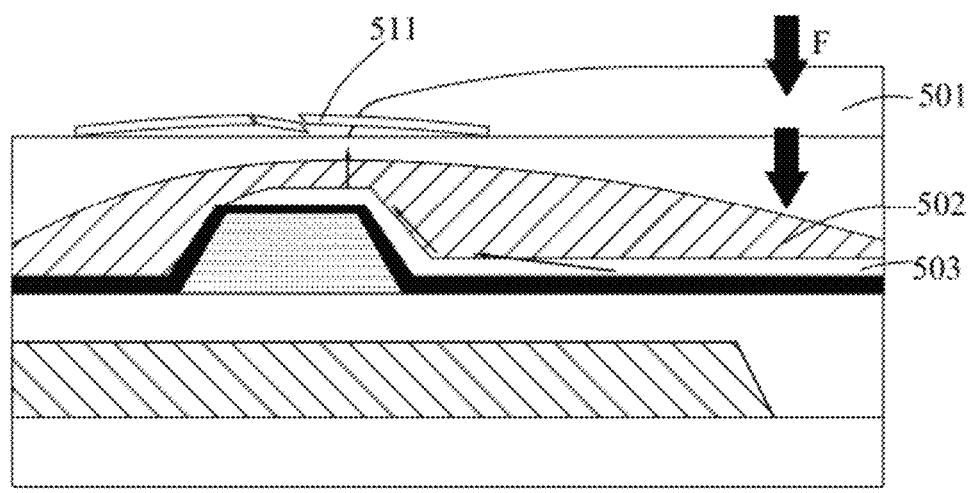
Figure 3:
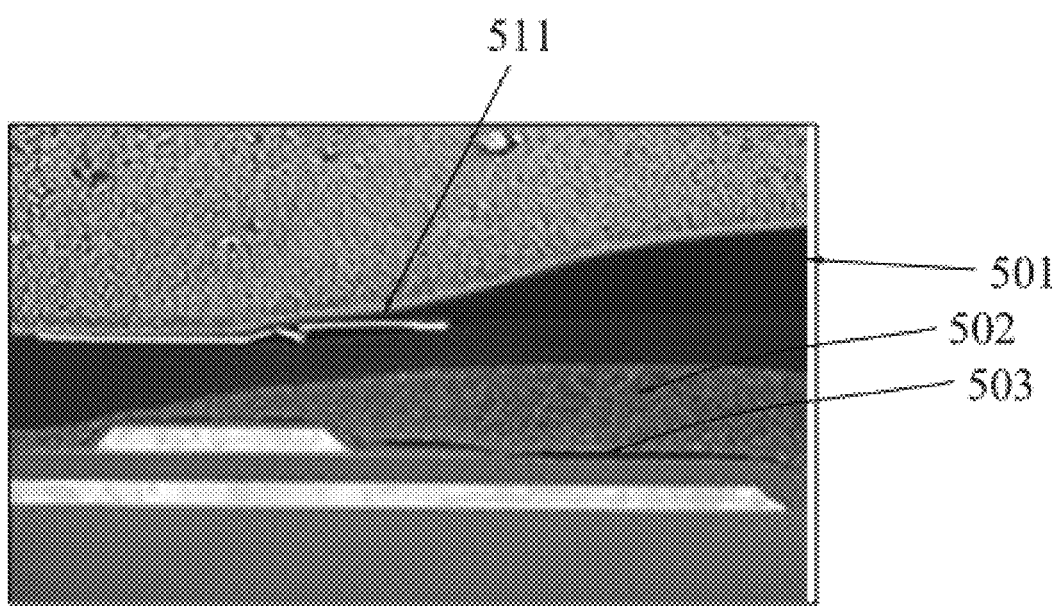
FIG. 3 is an electron microscope cross-sectional view of the array substrate of FIG. 1 along the line A-A, showing that the connection line is broken due to the crack in the color resist layer.
Figure 4:
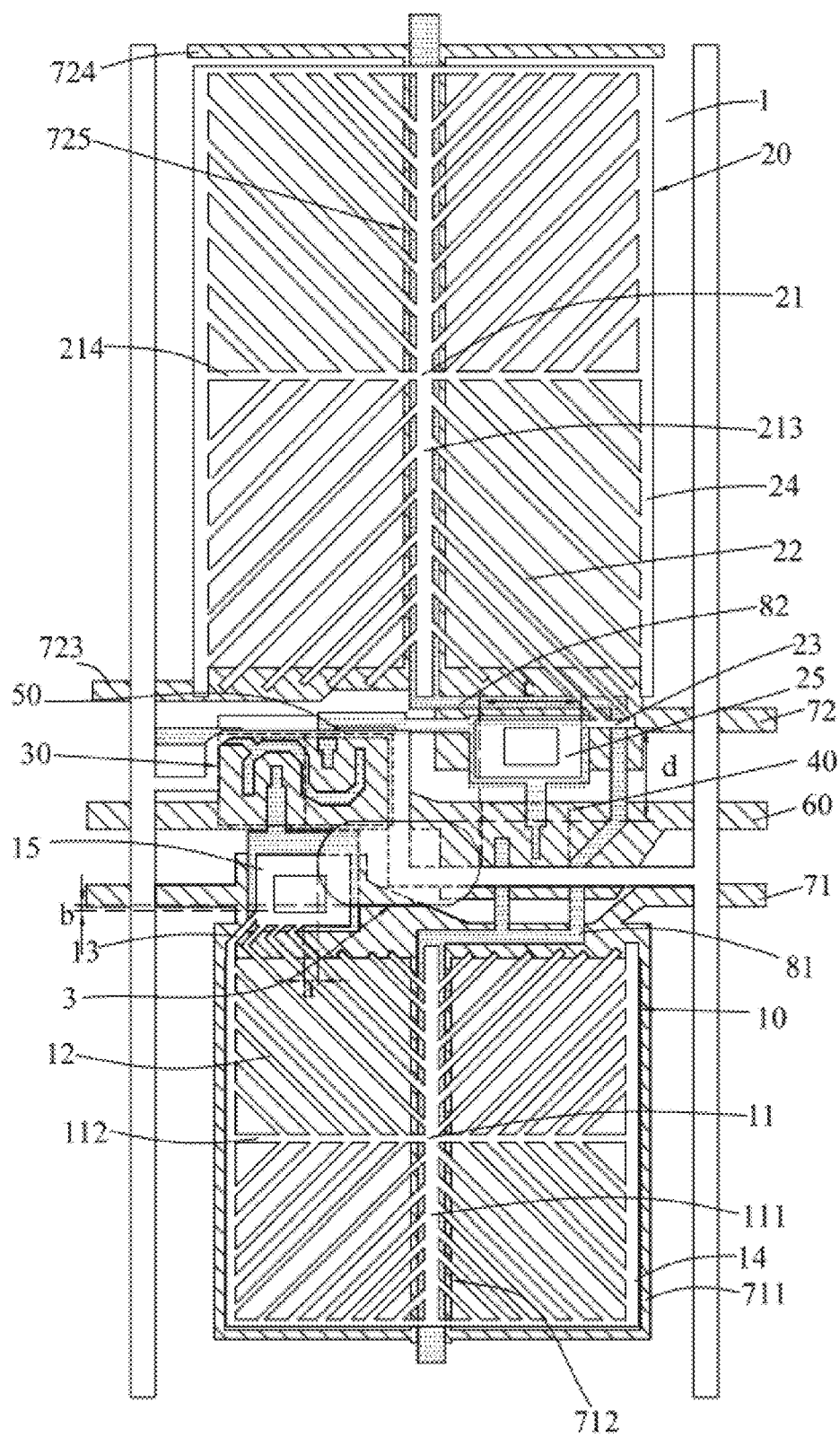
FIG. 4 is a schematic diagram of an array substrate according to an embodiment of the present disclosure.

Please refer to FIG. 4, the present disclosure provides an array substrate 100. The array substrate 100 comprises a base substrate 1, a pixel unit, and a spacer 3. The pixel unit is disposed on the base substrate 1 and comprises a main pixel electrode 10, a sub pixel electrode 20, and a first thin film transistor 30 disposed between the main pixel electrode 10 and the sub pixel electrode 20. The main pixel electrode 10 comprises a first main electrode 11, a plurality of first branch electrodes 12, and a plurality of first connection lines 13. In this embodiment, a number of the first connection lines 13 is 4, but is not limited thereto. The number of the first connection lines 13 is at least two. The first main electrode 11 comprises a first strip electrode 111 and a second strip electrode 112 crossing each other. In an embodiment, the first strip electrode 111 and the second strip electrode 112 may intersect vertically, but is not limited thereto. The first branch electrodes 12 extend diagonally from the first main electrode 11. Each of the first connection lines 13 extends from a corresponding first branch electrode 12 and is electrically connected to the first thin film transistor 30. Specifically, the main pixel electrode 10 further comprises a first connection portion 15 connected to the first connection lines 13. Please refer to FIG. 5, the first thin film transistor 30 comprises a first drain electrode 31, a first drain extension portion 311 extending from the first drain electrode 31, and a first source electrode 32. The first connection portion 15 is electrically connected to the first drain extension portion 311 through a first via hole 91, so that the first connection lines 13 are electrically connected to the first thin film transistor 30. The spacer 3 is disposed on the pixel unit and between the main pixel electrode 10 and the sub pixel electrode 20. A projection of the spacer 3 on the base substrate 1 and a projection of the first connection lines 13 on the base substrate 1 do not overlap, and the two projections do not overlap in a direction parallel to the first strip electrode 111 and a direction parallel to the second strip electrode 112. The spacer 3 is configured to maintain uniformity of a liquid crystal cell gap after the array substrate 100 and another substrate form a panel.

Please refer to FIG. 4, in an embodiment, the projection of the spacer 3 on the base substrate 1 and the projection of the first connection lines 13 on the base substrate 1 are separated by a first distance a in the direction parallel to the first strip electrode 111, and by a second distance b in the direction parallel to the second strip electrode 112. The first distance a and the second distance b are greater than 0 µm. The first distance a and the second distance b may be same or different. The first distance a and the second distance b can be adjusted according to actual needs.

Please refer to FIG. 4, in an embodiment, the main pixel electrode 10 further comprises a U-shaped first frame electrode 14. A notch of the U-shaped first frame electrode 14 faces the sub pixel electrode 20. That is, both ends of the first frame electrode 14 face the sub pixel electrode 20. One of the first connection lines 13 extends from one of the ends of the first frame electrode 14 and is electrically connected to the first thin film transistor 30.

Figure 5:
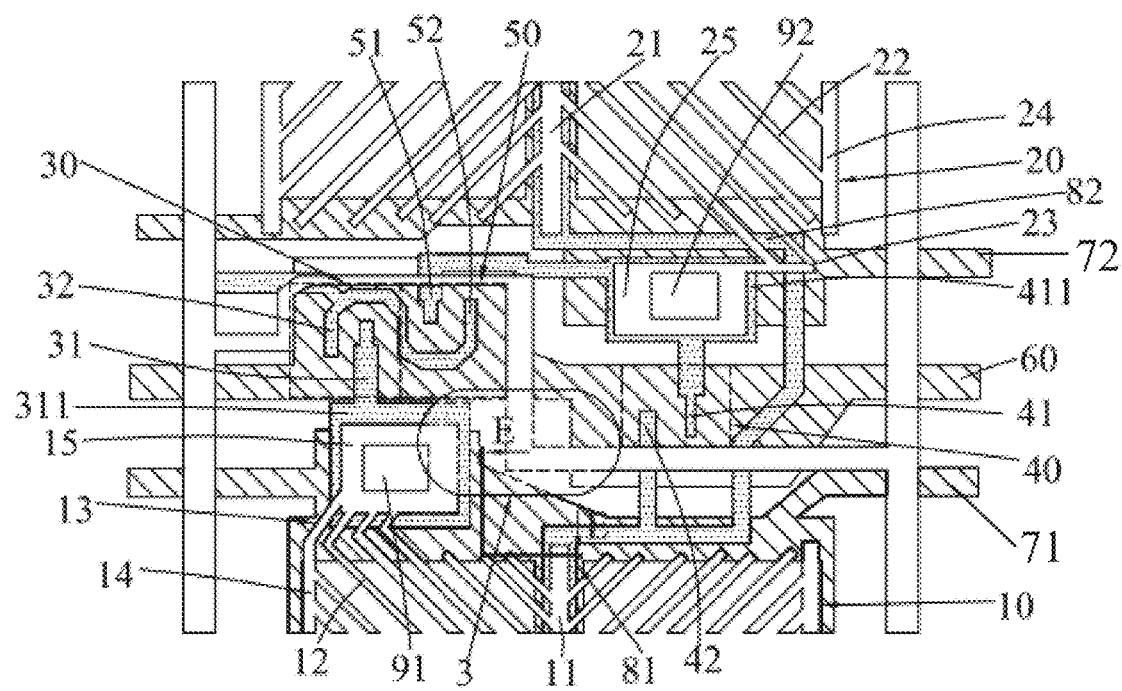
FIG. 5 is a partial enlarged schematic diagram of the array substrate of FIG. 4

Please refer to FIG. 4 and FIG. 5, in an embodiment, the pixel unit further comprises a second thin film transistor 40 disposed between the main pixel electrode 10 and the sub pixel electrode 20. The sub pixel electrode 20 comprises a second main electrode 21, a plurality of second branch electrodes 22, and a plurality of second connection lines 23. In this embodiment, a number of the second connection lines 23 is 2, but is not limited thereto. In an embodiment, the number of the second connection lines 23 may be 3, 4, 5, or more. The number of the second connection lines 23 is at least two. The second main electrode 21 comprises a third strip electrode 213 and a fourth strip electrode 214 crossing each other. In an embodiment, the third strip electrode 213 and the fourth strip electrode 214 may intersect vertically, but is not limited thereto. The third strip electrode 213 may be parallel to the first strip electrode 111. The fourth strip electrode 214 may be parallel to the second strip electrode 112. The second branch electrodes 22 extend diagonally from the second main electrode 21. Each of the second connection lines 23 extends from a corresponding second branch electrode 22 and is electrically connected to the second thin film transistor 40. Specifically, the sub pixel electrode 20 further comprises a second connection portion 25 connected to the second connection lines 23. The second thin film transistor 40 comprises a second drain electrode 41, a second drain extension portion 411 extending from the second drain electrode 41, and a second source electrode 42. The second connection portion 25 is electrically connected to the second drain extension portion 411 through a second via hole 92, so that the second connection lines 23 are electrically connected to the second thin film transistor 41. The projection of the spacer 3 on the base substrate 1 and a projection of the second connection lines 23 on the base substrate 1 do not overlap, and the two projections do not overlap in a direction parallel to the third strip electrode 213 and a direction parallel to the fourth strip electrode 214.

Please refer to FIG. 4, in an embodiment, the projection of the spacer 3 on the base substrate 1 and the projection of the second connection lines 23 on the base substrate 1 are separated by a third distance c in the direction parallel to the third strip electrode 213, and by a fourth distance d in the direction parallel to the fourth strip electrode 214. The third distance c and the fourth distance d are greater than 0 µm. The third distance c and the fourth distance d may be same or different. The third distance c and the fourth distance d can be adjusted according to actual needs.

Please refer to FIG. 4, in an embodiment, the sub pixel electrode 20 further comprises a U-shaped second frame electrode 24. A notch of the U-shaped second frame electrode 24 faces the main pixel electrode 10. That is, both ends of the second frame electrode 24 face the main pixel electrode 10. One of the second connection lines 23 extends from one of the ends of the second frame electrode 24 and is electrically connected to the second thin film transistor 40.

Please refer to FIG. 5, in an embodiment, the pixel unit further comprises a third thin film transistor 50 disposed between the main pixel electrode 10 and the sub pixel electrode 20. The third thin film transistor 50 comprises a third drain electrode 51 and a third source electrode 52. In an embodiment, the first source electrode 32 of the first thin film transistor 30 and the third source electrode 52 of the third thin film transistor 50 are integrally formed.

Please refer to FIG. 5, in an embodiment, the pixel unit further comprises a gate line 60 disposed on the base substrate 1 and passing through the first thin film transistor 30, the second thin film transistor 40, and the third thin film transistor 50 to serve as gate electrodes of the first thin film transistor 30, the second thin film transistor 40, and the third thin film transistor 50.

Figure 6:
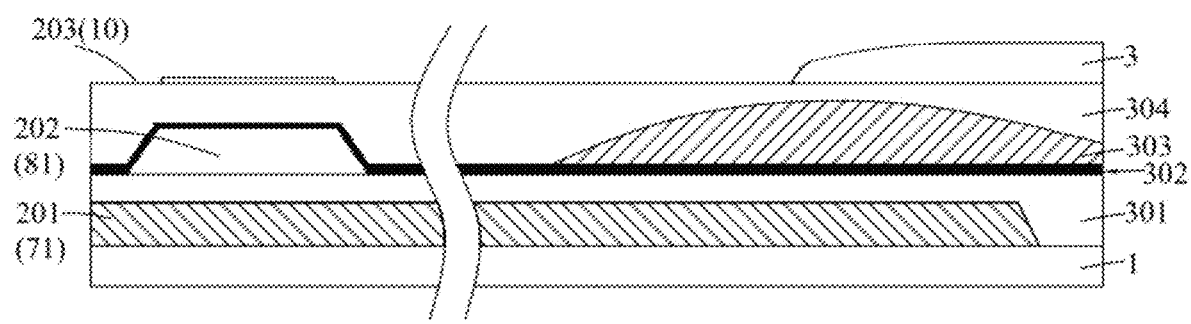
FIG. 6 is a schematic cross-sectional view of the array substrate of FIG. 5 along line E-E.

Please refer to FIG. 5, the pixel unit further comprises a first common electrode 71 and a second common electrode 72. The first common electrode 71 and the second common electrode 72 are disposed on the base substrate 1. The first common electrode 71, the second common electrode 72, and the gate line 60 are disposed on a same layer, that is, are formed by patterning a first metal layer. Please refer to FIG. 6, a patterned first metal layer 201 comprises the first common electrode 71, the second common electrode 72, and the gate line 60.

In this embodiment, the first common electrode 71 comprises a first electrode 711 and a second electrode 712. The first electrode 711 is shaped into a frame structure. A projection of the first electrode 711 on the base substrate 1 surrounds a projection of the main pixel electrode 10 on the base substrate 1. The projection of the first electrode 711 on the base substrate 1 and a projection of the first frame electrode 14 on the base substrate 1 do not overlap, partially overlap, or completely overlap. The second electrode 712 is configured to connect opposite sides of the first electrode 711 in the direction parallel to the first strip electrode 111. A projection of the second electrode 712 on the base substrate 1 and a projection of the first strip electrode 111 on the base substrate 1 partially overlap or completely overlap.

In this embodiment, the second common electrode 72 is shaped into an I-shaped structure and comprises a third electrode 723, a fourth electrode 724, and a fifth electrode 725. The third electrode 723 and the fourth electrode 724 are parallel to the fourth strip electrode 214 of the sub pixel electrode 20. The fifth electrode 725 is perpendicular to the third electrode 723 and the fourth electrode 724. Both ends of the fifth electrode 725 are connected to a center of the third electrode 723 and a center of the fourth electrode 724, respectively. A projection of the third electrode 723 and a projection of the fourth electrode 724 on the base substrate 1 are located on two opposite sides of a projection of the sub pixel electrode 20 on the base substrate 1. A projection of the fifth electrode 725 on the base substrate 1 and a projection of the third strip electrode 213 on the base substrate 1 partially overlap or completely overlap.

In an embodiment, the first common electrode 71 may also be shaped into the aforementioned shape of the second common electrode 72. In an embodiment, the second common electrode 72 may also be shaped into the aforementioned shape of the first common electrode 71. In an embodiment, the first common electrode 71 and the second common electrode 72 may also be shaped into other shapes.

Please refer to FIG. 5, the pixel unit further comprises a first data line 81 and a second data line 82. The first data line 81, the second data line 82, the first drain electrode 31, the first drain extension portion 311, the first source electrode 32, the second drain electrode 41, the second drain extension portion 411, the second source electrode 42, the third drain electrode 51, and the third source electrode 52 are disposed on a same layer, that is, are formed by patterning a second metal layer. Please refer to FIG. 6, a patterned second metal layer 202 comprises the first data line 81, the second data line 82, the first drain electrode 31, the first drain extension portion 311, the first source electrode 32, the second drain electrode 41, the second drain extension portion 411, the second source electrode 42, the third drain electrode 51, and the third source electrode 52. The patterned second metal layer 202 is disposed on the patterned first metal layer 201. A first insulating layer 301 is disposed between the patterned first metal layer 201 and the patterned second metal layer 202. The first source electrode 32 and the third source electrode 52 may be integrally formed. The first data line 81, the second data line 82, and the second source electrode 42 may be integrally formed. The second drain electrode 41, the second drain extension portion 411, and the third drain electrode 51 may be integrally formed. The first data line 81 is parallel to the first strip electrode 111. A projection of the first data line 81 on the base substrate 1 and the projection of the first strip electrode 111 on the base substrate 1 partially overlap or completely overlap. The second data line 82 is parallel to the third strip electrode 213. A projection of the second data line 82 on the base substrate 1 and the projection of the third strip electrode 213 on the base substrate 1 partially overlap or completely overlap.

In an embodiment, the array substrate 100 may be a photo spacer on array (POA). The pixel unit may be a polymer sustained vertical alignment (PSVA) pixel having 8 domains and 3 transistors (3T_8 domain). The main pixel electrode 10 and the sub pixel electrode 20 are disposed on a same layer, that is, are formed by patterning a third metal layer. Please refer to FIG. 6, a patterned third metal layer 203 comprises the main pixel electrode 10 and the sub pixel electrode 20. The patterned third metal layer 203 is disposed on the patterned second metal layer 202. A second insulating layer 302, a color resist layer 303, and a flat layer 304 are sequentially disposed between the patterned second metal layer 202 and the patterned third metal layer 203 from bottom to top. The color resist layer 303 comprises red, green, and blue color resists. The spacer 3 is disposed on the flat layer 304 and does not cover the patterned third metal layer 203.

In an embodiment, the array substrate 100 comprises a plurality of the aforementioned pixel units, which are disposed on the base substrate 1 in an array. Each of the pixel units is disposed with the aforementioned spacer 3 in the aforementioned manner.

In an embodiment, the array substrate 100 can be applied to a curved panel.

The present disclosure further provides a method for fabricating an array substrate 100. The method comprises the following steps.

Step 1: providing a base substrate 1.

Step 2: forming a pixel unit on the base substrate 1. The pixel unit comprises a main pixel electrode 10, a sub pixel electrode 20, and a first thin film transistor 30 disposed between the main pixel electrode 10 and the sub pixel electrode 20. The main pixel electrode 10 comprises a first main electrode 11, a plurality of first branch electrodes 12, and a plurality of first connection lines 13. The first main electrode 11 comprises a first strip electrode 111 and a second strip electrode 112 crossing each other. In an embodiment, the first strip electrode 111 and the second strip electrode 112 may intersect vertically, but is not limited thereto. The first branch electrodes 12 extend diagonally from the first main electrode 11. In this embodiment, a number of the first connection lines 13 is 4, but is not limited thereto. The number of the first connection lines 13 is at least two. Each of the first connection lines 13 extends from a corresponding first branch electrode 12 and is electrically connected to the first thin film transistor 30. Specifically, the main pixel electrode 10 further comprises a first connection portion 15 connected to the first connection lines 13. Please refer to FIG. 5, the first thin film transistor 30 comprises a first drain electrode 31, a first drain extension portion 311 extending from the first drain electrode 31, and a first source electrode 32. The first connection portion 15 is electrically connected to the first drain extension portion 311 through a first via hole 91, so that the first connection lines 13 are electrically connected to the first thin film transistor 30.

Step 3: forming a spacer 3 on the pixel unit and between the main pixel electrode 10 and the sub pixel electrode 20. A projection of the spacer 3 on the base substrate 1 and a projection of the first connection lines 13 on the base substrate 1 do not overlap, and the two projections do not overlap in a direction parallel to the first strip electrode 111 and in a direction parallel to the second strip electrode 112.

Please refer to FIG. 4, in an embodiment, the projection of the spacer 3 on the base substrate 1 and the projection of the first connection lines 13 on the base substrate 1 are separated by a first distance a in the direction parallel to the first strip electrode 111, and by a second distance b in the direction parallel to the second strip electrode 112. The first distance a and the second distance b are greater than 0 μm. The first distance a and the second distance b may be same or different. The first distance a and the second distance b can be adjusted according to actual needs.

Please refer to FIG. 4, in an embodiment, the main pixel electrode 10 further comprises a U-shaped first frame electrode 14. A notch of the U-shaped first frame electrode 14 faces the sub pixel electrode 20. That is, both ends of the first frame electrode 14 face the sub pixel electrode 20. One of the first connection lines 13 extends from one of the ends of the first frame electrode 14 and is electrically connected to the first thin film transistor 30.

Please refer to FIG. 4 and FIG. 5, in an embodiment, the pixel unit further comprises a second thin film transistor 40 disposed between the main pixel electrode 10 and the sub pixel electrode 20. The sub pixel electrode 20 comprises a second main electrode 21, a plurality of second branch electrodes 22, and a plurality of second connection lines 23. The second main electrode 21 comprises a third strip electrode 213 and a fourth strip electrode 214 crossing each other. In an embodiment, the third strip electrode 213 and the fourth strip electrode 214 may intersect vertically, but is not limited thereto. The third strip electrode 213 may be parallel to the first strip electrode 111. The fourth strip electrode 214 may be parallel to the second strip electrode 112. The second branch electrodes 22 extend diagonally from the second main electrode 21. In this embodiment, a number of the second connection lines 23 is 2, but is not limited thereto. In an embodiment, the number of the second connection lines 23 may be 3, 4, 5, or more. The number of the second connection lines 23 is at least two. Each of the second connection lines 23 extends from a corresponding second branch electrode 22 and is electrically connected to the second thin film transistor 40. Specifically, the sub pixel electrode 20 further comprises a second connection portion 25 connected to the second connection lines 23. The second thin film transistor 40 comprises a second drain electrode 41 and a second drain extension portion 411 extending from the second drain electrode 41. The second connection portion 25 is electrically connected to the second drain extension portion 411 through a second via hole 92, so that the second connection lines 23 are electrically connected to the second thin film transistor 41. The projection of the spacer 3 on the base substrate 1 and a projection of the second connection lines 23 on the base substrate 1 do not overlap, and the two projections do not overlap in a direction parallel to the third strip electrode 213 and a direction parallel to the fourth strip electrode 214.

Please refer to FIG. 4, in an embodiment, the projection of the spacer 3 on the base substrate 1 and the projection of the second connection lines 23 on the base substrate 1 are separated by a third distance c in the direction parallel to the third strip electrode 213, and by a fourth distance d in the direction parallel to the fourth strip electrode 214. The third distance c and the fourth distance d are greater than 0 μm. The third distance c and the fourth distance d may be same or different. The third distance c and the fourth distance d can be adjusted according to actual needs.

Please refer to FIG. 4, in an embodiment, the sub pixel electrode 20 further comprises a U-shaped second frame electrode 24. A notch of the U-shaped second frame electrode 24 faces the main pixel electrode 10. That is, both ends of the second frame electrode 24 face the main pixel electrode 10. One of the second connection lines 23 extends from one of the ends of the second frame electrode 24 and is electrically connected to the second thin film transistor 40.

Please refer to FIG. 4, in an embodiment, the pixel unit further comprises a third thin film transistor 50, a gate line 60, a first common electrode 71, a second common electrode 72, a first data line 81, and a second data line 82. For details of these elements and other details of the array substrate 100, please refer to the previous description, and will not be described in detail herein.

In the array substrate and the method for fabricating the same provided by the present disclosure, the connection lines of the main pixel electrode and/or the sub pixel electrode are disposed far away from the spacer, so that the projections of the spacer and the connection lines of the main pixel electrode and/or the sub pixel electrode on the base substrate do not overlap, nor do they overlap in the direction parallel to the first/third strip electrode and the direction parallel to the second/fourth strip electrode. Preferably, distances between the projection of the spacer on the base substrate and the projections of the connection lines of the main pixel electrode and/or the sub pixel electrode on the base substrate in the direction parallel to the first/third strip electrode and the direction parallel to the second/fourth strip electrode are greater than 0 μm. Therefore, it is difficult for an external force to make a crack in a color resist layer spread to an underside of the connection lines away from the spacer, thereby preventing the connecting lines from being broken. Furthermore, the connection lines of the main pixel electrode and/or the sub pixel electrode are designed to be multiple, so that when one or two connection lines are broken, a signal can still be transmitted to the main pixel electrode and/or the sub pixel electrode through other unbroken connection lines. Therefore, the present invention can effectively prevent poor display of the array substrate.

The present invention has been described in the above preferred embodiments, but the above preferred embodiments are not intended to limit the present invention. The scope of the present invention is determined by claims. Those skilled in the art may make various changes and modifications without departing from the scope of the present invention. For example, in the above embodiments, a pixel unit with an eight-domain structure is taken as an example. However, those skilled in the art can apply the concept of the present invention to a pixel unit with another multi-domain structure.

What is claimed is:

1. An array substrate, comprising:
a base substrate;
a pixel unit disposed on the base substrate and comprising a main pixel electrode, a sub pixel electrode, and a first thin film transistor disposed between the main pixel electrode and the sub pixel electrode, wherein the main pixel electrode comprises:
a first main electrode comprising a first strip electrode and a second strip electrode crossing each other;
a plurality of first branch electrodes extending diagonally from the first main electrode; and
a plurality of first connection lines, wherein each of the first connection lines extends from the corresponding first branch electrode and is electrically connected to the first thin film transistor; and
a spacer disposed isolated on the pixel unit and between the main pixel electrode and the sub pixel electrode, wherein a projection of the spacer on the base substrate and a projection of the first connection lines on the base substrate do not overlap, and the two projections do not overlap in a direction parallel to the first strip electrode and a direction parallel to the second strip electrode,
wherein the spacer, the main pixel electrode, and the sub pixel electrode are arranged at a same height.

2. The array substrate according to claim 1, wherein the projection of the spacer on the base substrate and the projection of the first connection lines on the base substrate are separated by a first distance in the direction parallel to the first strip electrode, and by a second distance in the direction parallel to the second strip electrode.

3. The array substrate according to claim 1, wherein the main pixel electrode further comprises a U-shaped first frame electrode, and one of the first connection lines extends from one of ends of the first frame electrode and is electrically connected to the first thin film transistor.

4. The array substrate according to claim 1, wherein
the main pixel electrode further comprises a first connection portion connected to the first connection lines;
the first thin film transistor comprises a first drain electrode and a first drain extension portion extending from the first drain electrode; and
the first connection portion is electrically connected to the first drain extension portion through a first via hole, so that the first connection lines are electrically connected to the first thin film transistor.

5. The array substrate according to claim 1, wherein
the pixel unit further comprises a second thin film transistor disposed between the main pixel electrode and the sub pixel electrode;
the sub pixel electrode comprises:
a second main electrode comprising a third strip electrode and a fourth strip electrode crossing each other, wherein the third strip electrode is parallel to the first strip electrode;

a plurality of second branch electrodes extending diagonally from the second main electrode; and
a plurality of second connection lines, wherein each of the second connection lines extends from the corresponding second branch electrode and is electrically connected to the second thin film transistor; and
the projection of the spacer on the base substrate and a projection of the second connection lines on the base substrate do not overlap, and the two projections do not overlap in a direction parallel to the third strip electrode and a direction parallel to the fourth strip electrode.

6. The array substrate according to claim 5, wherein the projection of the spacer on the base substrate and the projection of the first connection lines on the base substrate are separated by a first distance in the direction parallel to the first strip electrode, and by a second distance in the direction parallel to the second strip electrode; the projection of the spacer on the base substrate and the projection of the second connection lines on the base substrate are separated by a third distance in the direction parallel to the third strip electrode, and by a fourth distance in the direction parallel to the fourth strip electrode.

7. The array substrate according to claim 5, wherein the main pixel electrode further comprises a U-shaped first frame electrode, and one of the first connection lines extends from one of ends of the first frame electrode and is electrically connected to the first thin film transistor; the sub pixel electrode further comprises a U-shaped second frame electrode, and one of the second connection lines extends from one of ends of the second frame electrode and is electrically connected to the second thin film transistor.

8. The array substrate according to claim 5, wherein
the sub pixel electrode further comprises a second connection portion connected to the second connection lines;
the second thin film transistor comprises a second drain electrode and a second drain extension portion extending from the second drain electrode; and
the second connection portion is electrically connected to the second drain extension portion through a second via hole, so that the second connection lines are electrically connected to the second thin film transistor.

9. A method for fabricating an array substrate, comprising:
providing a base substrate;
forming a pixel unit on the base substrate, wherein the pixel unit comprises a main pixel electrode, a sub pixel electrode, and a first thin film transistor disposed between the main pixel electrode and the sub pixel electrode, and the main pixel electrode comprises:
a first main electrode comprising a first strip electrode and a second strip electrode crossing each other;
a plurality of first branch electrodes extending diagonally from the first main electrode; and
a plurality of first connection lines, wherein each of the first connection lines extends from the corresponding first branch electrode and is electrically connected to the first thin film transistor; and
forming a spacer disposed isolated on the pixel unit and between the main pixel electrode and the sub pixel electrode, wherein a projection of the spacer on the base substrate and a projection of the first connection lines on the base substrate do not overlap, and the two projections do not overlap in a direction parallel to the first strip electrode and a direction parallel to the second strip electrode, wherein the spacer, the main pixel electrode, and the sub pixel electrode are arranged at a same height.

10. The method for fabricating the array substrate according to claim 9, wherein the projection of the spacer on the base substrate and the projection of the first connection lines on the base substrate are separated by a first distance in the direction parallel to the first strip electrode, and by a second distance in the direction parallel to the second strip electrode.

11. The method for fabricating the array substrate according to claim 9, wherein the main pixel electrode further comprises a U-shaped first frame electrode, and one of the first connection lines extends from one of ends of the first frame electrode and is electrically connected to the first thin film transistor.

12. The method for fabricating the array substrate according to claim 9, wherein the main pixel electrode further comprises a first connection portion connected to the first connection lines;

the first thin film transistor comprises a first drain electrode and a first drain extension portion extending from the first drain electrode; and the first connection portion is electrically connected to the first drain extension portion through a first via hole, so that the first connection lines are electrically connected to the first thin film transistor.

13. The method for fabricating the array substrate according to claim 9, wherein the pixel unit further comprises a second thin film transistor disposed between the main pixel electrode and the sub pixel electrode;

the sub pixel electrode comprises:

a second main electrode comprising a third strip electrode and a fourth strip electrode crossing each other, wherein the third strip electrode is parallel to the first strip electrode;

a plurality of second branch electrodes extending diagonally from the second main electrode; and a plurality of second connection lines, wherein each of the second connection lines extends from the corresponding second branch electrode and is electrically connected to the second thin film transistor; and the projection of the spacer on the base substrate and a projection of the second connection lines on the base substrate do not overlap, and the two projections do not overlap in a direction parallel to the third strip electrode and a direction parallel to the fourth strip electrode.

14. The method for fabricating the array substrate according to claim 13, wherein the projection of the spacer on the base substrate and the projection of the first connection lines on the base substrate are separated by a first distance in the direction parallel to the first strip electrode, and by a second distance in the direction parallel to the second strip electrode; the projection of the spacer on the base substrate and the projection of the second connection lines on the base substrate are separated by a third distance in the direction parallel to the third strip electrode, and by a fourth distance in the direction parallel to the fourth strip electrode.

15. The method for fabricating the array substrate according to claim 13, wherein the projection of the spacer on the base substrate and the projection of the first connection lines on the base substrate are separated by a first distance in the direction parallel to the first strip electrode, and by a second distance in the direction parallel to the second strip electrode; the sub pixel electrode further comprises a U-shaped second frame electrode, and one of the second connection lines extends from one of ends of the second frame electrode and is electrically connected to the second thin film transistor.

16. The method for fabricating the array substrate according to claim 13, wherein the sub pixel electrode further comprises a second connection portion connected to the second connection lines;

the second thin film transistor comprises a second drain electrode and a second drain extension portion extending from the second drain electrode; and the second connection portion is electrically connected to the second drain extension portion through a second via hole, so that the second connection lines are electrically connected to the second thin film transistor.

* * * * *